United States Patent [19]

Yamazaki

[11] Patent Number: 5,401,716
[45] Date of Patent: Mar. 28, 1995

[54] METHOD FOR MANUFACTURING SUPERCONDUCTING PATTERNS

[75] Inventor: Shunpei Yamazaki, Tokyo, Japan

[73] Assignee: Semiconductor Energy Laboratory Co., Ltd., Kanagawa, Japan

[21] Appl. No.: 829,531

[22] Filed: Feb. 3, 1992

Related U.S. Application Data

[63] Continuation of Ser. No. 239,288, Sep. 1, 1988, abandoned, which is a continuation-in-part of Ser. No. 176,144, Mar. 31, 1988, abandoned.

[30] Foreign Application Priority Data

Apr. 15, 1987 [JP] Japan ................... 62-93732
Sep. 7, 1987 [JP] Japan ................... 62-223675
Sep. 16, 1987 [JP] Japan ................... 62-231888

[51] Int. Cl.$^6$ ............................ B05D 5/12; B05D 3/06
[52] U.S. Cl. ............................ 505/329; 505/330
[58] Field of Search ............................ 437/910, 874, 16; 357/5; 365/162, 817, 832, 873, 922

[56] References Cited

U.S. PATENT DOCUMENTS

| | | |
|---|---|---|
| 4,470,190 | 9/1984 | Fulton et al. |
| 4,957,900 | 9/1990 | Yamazaki . |
| 4,960,751 | 10/1990 | Yamazaki . |
| 4,980,338 | 12/1990 | Yamazaki . |
| 5,051,396 | 9/1991 | Yamazaki . |
| 5,079,222 | 1/1992 | Yamazaki . |
| 5,098,884 | 3/1992 | Yamazaki . |

FOREIGN PATENT DOCUMENTS 1553945  6/1977  United Kingdom .

OTHER PUBLICATIONS

Arthur L. Robinson, "IBM Superconductor Leaps Current Hurdle", Research News, 5 Jun. 1987, p. 1189.
Miroru Suzuki, "Preparation and Properties of Superconducting Ba Pb1−xBi$_x$O$_3$ Thin Films by Sputtering" J. Appl. Physics, Mar. 1982, pp. 1622-1630.
K. Moriwaki, "Electrical Properties of Superconducting (La1−x SR$_x$)$_2$CuO$_4$ and Ba$_2$YCu$_3$O$_{7−\delta}$ Thin Films" Proc. of Symposium S, MRS 1987 Spring Meeting Apr. 23-24, 1987, pp. 85-87.
Koch et al., "Quantum Interference Devices from Superconducting Oxide Thin Films", App. Phys. Lett, (51), (3) Jul. 87 pp. 200–202.
Koch et al., "Thin Films and Squids Made From YaBa$_2$Cu$_3$ O$_y$," Presented at MRS Conf. Apr. 1987.
Tanabe "Grain Boundary Josephson Junctions Using Ya—Ba—Cu—O Films Operative at 77K" J. App. Physics, Dec. 1987 pp. L1961-1963.
Kajitani, "Crystal Structures O1YBa$_2$Cu$_{3-SA}$S$_A$O$_{9-y}$(A=Ni 2n and Co)" Jpn. J. of App. Phys. Mar. 1988 pp. L354-357.
J. Van der Mass et al. "Improved low contact resistance in high-Tc Y—B—Cu—O Ceramic Superconductors" Nature vol. 328 13 Aug. 1987 pp. 603–604.
Singh et al. "High Temperature Superconducting Thin Films: High-Speed Electronics Perspective." American Vacuum Society Series 3 Nov. 6, 1987 pp. 211–220.
Braslau et al. "Fabrication of Planar Josephson junctions by Laser Irradiation" IBM TDB, vol. 18, No. 11, Apr. 1986, pp. 3845-3846.
Harris, "Preparations of Superconducting Week Links in Molbdenum Films by Ion Implementation". IEEE Trans. on Magnetics. Mar. 1975. pp. 785-788.
Youwen Xu et al. "Effects of Metal Substitutions (Fe and Ga) In Y Ba$_2$Cu$_3$O$_7$ on its Superconducting Properties and Microstructures", Extended Abstracts, High--Temperature Superconductor II Apr. 1988.
Applied Physics Letters, "Quantum interference devices made from superconducting oxie thin films"; vol. 51, No. 3 pp. 200–202.
Patent Abstracts of Japan; vol. 6, No. 95 (E-110) (973), Jun. 3, 1982.
JP-A-57 27079 (Nippon Denshin Denwa Kosha) Feb. 13, 1982, Abstract Applied Physics Letters, vol. 26, No. 4, pp. 204–206: "Superconducting Weak Links Formed By Ion Implantation" FIG. 1; pp. 204, 205.

Primary Examiner—Tom Thomas
Attorney, Agent, or Firm—Sixbey, Friedman, Leedom & Ferguson

[57] ABSTRACT

A manufacturing method of Josephson devices is described. A superconducting ceramic film is deposited on a non-conductive surface and partly spoiled in order to form a barrier film by which two superconducting regions is separated. The spoiling is performed by adding a spoiling element into the ceramic film by ion implantation.

21 Claims, 3 Drawing Sheets

METHOD FOR MANUFACTURING SUPERCONDUCTING PATTERNS

This application is a Continuation of Ser. No. 07/239,288, filed Sep. 1, 1988, now abandoned, which, in turn is a continuation-in-part of Ser. No. 07/176,144, filed Mar. 31, 1988, now abandoned.

BACKGROUND OF THE INVENTION

This invention relates to a method of manufacturing superconducting patterns.

Along with efforts to make integrated circuits more dense, high operational speeds are required. The fine structures of electric circuits give rise to problems of decrease in operational speed and in reliability at exothermic parts of integrated circuits. Because of this, if semiconductor devices are driven at the boiling point of liquid nitrogen, the mobilities of electron and hole become 3-4 times as faster as those at room temperature and as a result the frequency characteristics can be improved.

The Josephson devices such as a memory which functions based on the Josephson effect are known as superconductive electronical devices. In this device, switching operation assciated with the Josephson effect is performed. A schematic view of an example of such a device is shown in FIG. 1. The device comprising a superconducting film 24 adjoined to a superconducting region formed within a substrate 21 with a barrier film 23 therebetween. The advantege of the device is operability at a very high frequency. However, the oxygen proportion contained in the superconducting ceramics of this type tend to be reduced.

SUMMARY OF THE INVENTION

It is therefore an object of the invention to provide a method of effectively manufacturing superconducting patterns.

It is another object of the present invention to provide a method of manufacturing superconducting patterns at high production yield.

In order to accomplish the above and other objects and advantages, non-superconducting regions are formed within ceramic superconductors by adding an element which fuctions to spoil the superconducting structure of the ceramics and insulating the same. The non-superconducting region is thermal annealed or fired. When a superconducting film is formed on a surface, the ( a, b ) plane in the crystalline film is aligned parallel to the underlying surface because current can flow along that plane 100 time as dense as along the normal direction thereto.

Preferred examles of the elements to be added to superconducting ceramics for the purpose of converting the superconducting structure to insulating non-superconducting structure are Si, Ge, B, Ga, P, Ta, Mg, Be, Al, Fe, Co, Ni, Cr, Ti, Mn and Zr. Preferred examles of the superconducting ceramic materials used in accordance with the present invent i on are represented by the stoichiometric formula, $(A_{1-x}B_x)_yCu_zO_w$, where A is one or more elements of Group IIIa of the Priodic Table, e.g., the rare earth elements or lanthanoides, B is one or more alkaline earth metals, i.e. Ba, Sr and Ca, and $x=0-1$; $y=2.0-4.0$, preferably 2.5-3.5; $z=1.0-4.0$, preferably 1.5-3.5; and $w=4.0-10.0$, preferably 6.0-8.0. When added to superconducting ceramics of this type, the spoiled non-superconducting ceramics are represented by the stoichiometric formula, referred to "non-superconducting ceramics" hereinafter, $[(A'_pA''_{1-p})_{1-x}(B'_qB''_{1-q})_x]_y(Cu_rX_{1-r})_zO_w$, where A' is one or more elements of Group IIIa of the Priodic Table, e.g., the rare earth elements or lantanoides, B' is one or more alkaline earth metals, i.e. Ba, Sr and Ca, A'', B'' and X are selected from a group consisting of Mg, Be, Al, Fe, Co, Ni, Cr, Ti, Mn and Zr, and $x=0.1-1$; $y=2.0-4.0$, preferably 2.5-3.5; $z=1.0-4.0$, preferably 1.5-3.5; and $w=4.0-10.0$, preferably 6.0-8.0. The numbers p, q and r are chosen to be 0.99 to 0.80 so that the total proportion of A'', B'' and X is 1-25 atom% in the ceramic material, particularly in case of Mg and Al, the proportion may be 1-10 atom % e.g. 5-10 atom %. The total density of the spoiling elements in a non-superconducting ceramic is about $5 \times 10^{18}$ to $6 \times 10^{21}$ cm$^{-3}$. Since the superconducting properties of superconducting ceramics are sensitive to proportion of thier constituents, the spoiling element can be selected from among the constituents of themselves. When superconducting constituents are employed as the spoiling element, the total density of the additional elements is $5 \times 10^{19}$ to $5 \times 10^{22}$ cm$^{-3}$.

DETAILED DESCRIPTION OF THE PREFERRED EMBODIMENTS

Figure 2A:
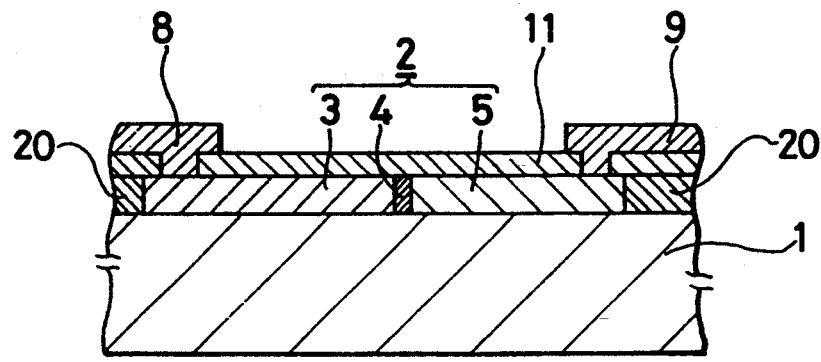
FIGS. 2(A) to 2(C) are cross sectional views showing first, second and third embodiments in accordance with the present invention.
Figure 2B:
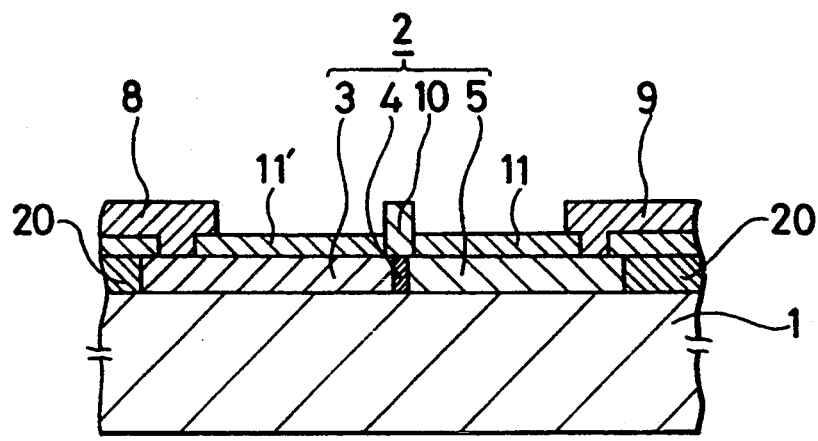
Figure 2C:
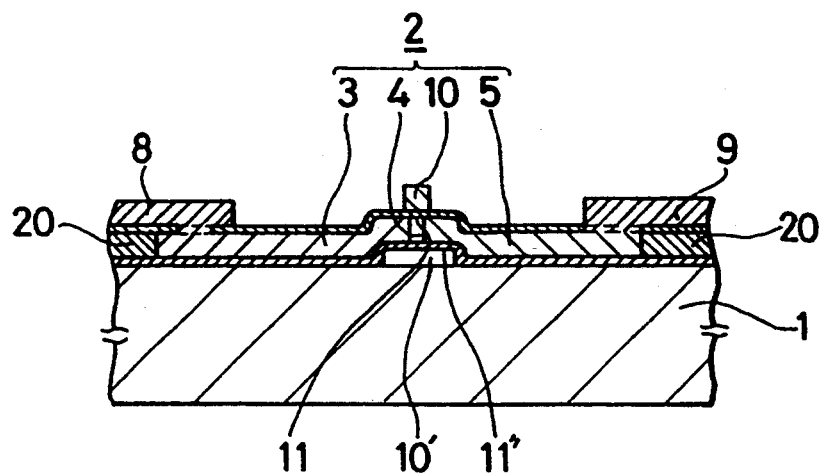

Referring to FIGS. 2(A) to 2(C), superconducting devices in accordance with the present invention is illustrated.

The device shown in FIG. 2(A) comprises a substrate 1 having a non-conductive upper surface such as a substrate of YSZ(yttria stabilized zircon), a pair of superconducting regions 3 and 5, an intervening barrier film 4 between the regions 3 and 5, insulating films 20 positioned at the opposed ends of the superconducting regions 3 and 5, an overlying passivation film 11 formed with openings 11-1 and 11-2 at the regions 3 and 5 and electrodes 8 and 9 electrically contacting the superconducting regions 3 and 5.

An examplary method of manufacturing the device will be described. First, a ceramic oxide film of composition in agreement with the composition of a superconducting material as specifically stated in the last portion of this description is formed on the substrate 1 by screen printing, sputtering, MBE (Molecular Beam Epitaxial), CVD and the other methods. At the same time or thereafter, the ceramic oxide is thermally annealed at 600°-950° C. for 5-20 hours followed by gradually cooling. In accordance with experimental, the critical temperature was measured to be 91K for example.

The barrier film 4 is formed after or before the annealing by adding a spoiling element such as alminium or magnesium by ion implantation to $5 \times 10^{18}$–$6 \times 10^{21}$ cm$^{-3}$, e.g. $2 \times 10^{20}$ cm$^{-3}$. This ion implantation is performed at an accelation voltage of 50-2000 KV with a photoresist mask covering the superconducting regions 3 and 5 so that the barrier film 4 and the insulating films 20 become "non-superconducting." The barrier film 4 is no wider than 1000Å in the lateral direction in order to permit tunnel current thereacross.

Figure 1:
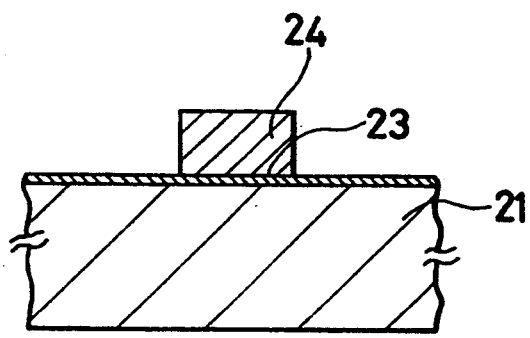
FIG. 1 is a schematic view showing a prior art superconducting device.
Figure 3:
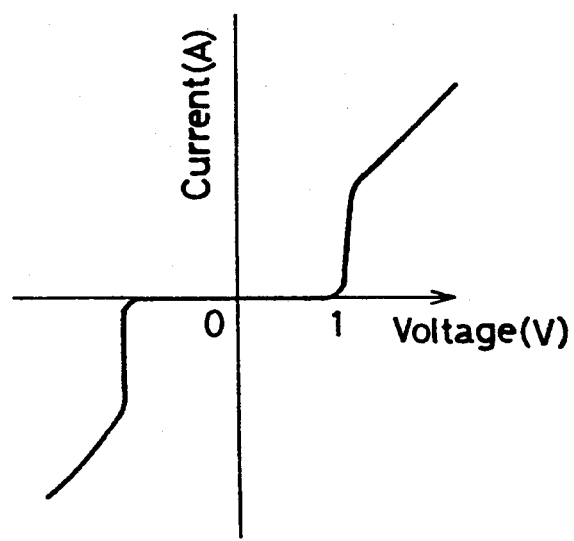
FIG. 3 is a graphical diagram showing the current voltage characteristic of devices in accordance with the present invention.

The passivation film 11 of an insulating ceramic having similar composition as the underlying superconducting cramic film is formed over the structure, followed by oxidation in an oxidizing atmosphere at 300°–950° C., e.g. 700° C. for the purpose of fitting the films of the structure together and compensating the oxygen proportion at the surface area. The passivation film 11 is spoiled in the same manner or formed by making use of a spoiled composition. The spoiling element is oxidized during this oxidation process. Then, after forming the openings 11-1 and 11-2, the lead electrodes 8 and 9 is formed in ohmic contact with the superconducting regions 3 and 5 respectively. The electrodes 8 and 9 may be formed of superconducting ceramics. In that case, the formation of the electrodes is preferably carried out before the annealing. FIG. 3 is an example of the voltage-current characteristic of the devices in accordance with the present invention.

In the previous example, the densities of the spoiling elememt in the barrier film 4 and the insulating films 20 are same. However, by separately effecting ion mplantation, the films 4 and 20 can be formed so that the density of the barrier film is 0.1 to 20 atom % which is 1/10–1/5, e.g. 1/5, of the densityh of the insulating films.

Referring to FIG. 2(B), a second embodiment of the present invention is illustrated. This embodiment is approximately same as the previous embodiment except for a contol electrode 10 formed over the barrier film 4 with the insulating film 11 therebetween. The current passing through the barrier film 4 is controlled by the applied voltage by the control electrode 10. In this embodiment, the barrier film 4 may be superconducting. In that case, the operation temperature of the device should be selected so that the superconducting barrier film 4 is in an intermediate state between superconducting state and non-superconducting state. Namely, the temperature is selected within the range from Tc onset and Tco. The action of the device is described in our U.S. patent application Ser. No. 167,987 filed on Mar. 14, 1988.

Referring to FIG. 2(C), a third embodiment is illustrated. This device is approximately same as the second embodiment except for provision of an underlying control electrode 10'. The barrier film 4 is sandwitched by the over lying control film 10 and the underlying cotrol film 10'.

Figure 4A:
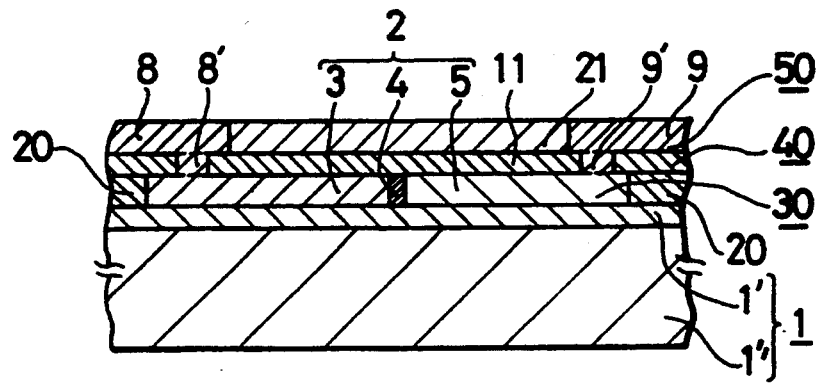
FIGS. 4(A) to 4(C) are cross sectional views showing first, second and third embodiments in accordance with the present invention.
Figure 4B:
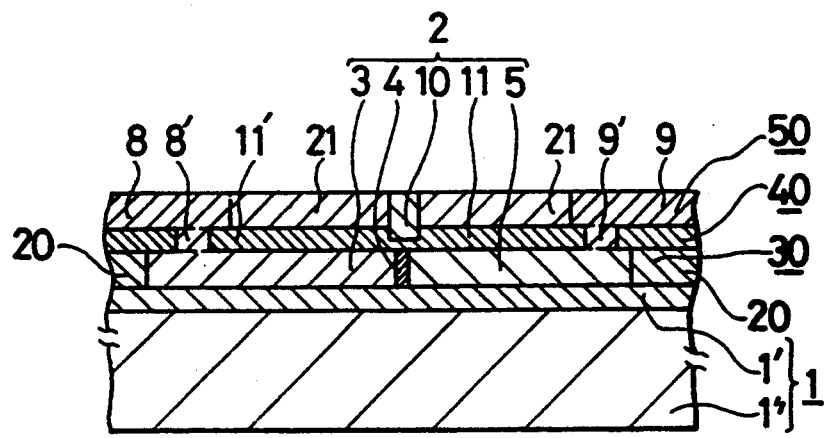
Figure 4C:
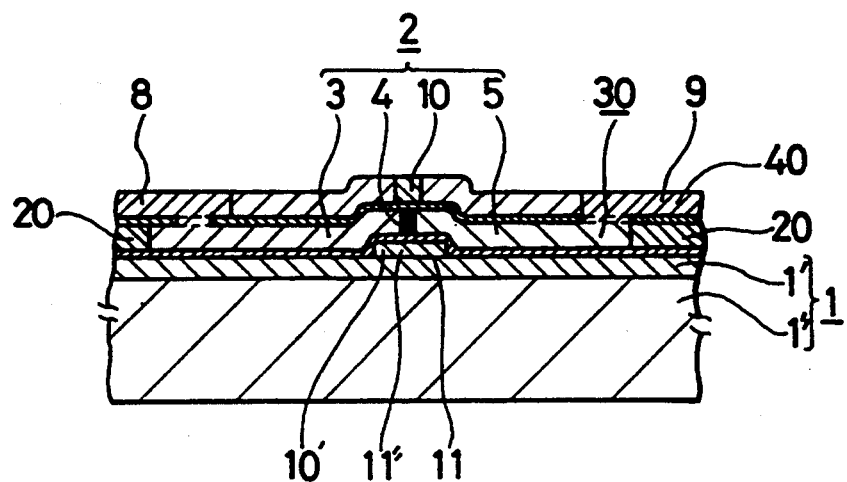

FIGS. 4(A) to 4(C) are modifications of the preceding embodiments shown in FIGS. 2(A) to 2(C) respectively. These embodiments are constructed in substantially same manner with the exception specified as below.

FIG. 4(A) is a cross section view showing a fourth embodiment of the present invention. The substrate 1" is a proportion of a silicon semiconductor substrate within which an integrated circuit is formed. The upper surface of the substrate 1" is made non-conductive by covering a ceramic oxide film 1'. After forming the superconducting regions 3 and 5, the barrier film 4 and the insulating films 20 on the substrate in the same manner, a superconducting ceramic oxide film 40 is formed and partly made non-superconducting by adding a spoiling element thereto except for connection portions 8' and 9'. Further, a superconducting ceramic film 50 is formed on the structure of the film followed by spoiling the superconducting structure except for the electrodes 8 and 9. Although the fabricating process substantially corresponds to that of preceding embodiments, the electrodes 8 and/or 9 which may be connected with the integrated circuit have not to be given thermal treatment at no lower than 400° C. in order to avoid oxidation of the silicon semi conductor by the oxygen content of the superconducting electrodes 8 and 9.

Referring to FIG. 4(B), a fifth embodiment of the present invention is illustrated. This embodiment is approximately same as the fourth embodiment except for a contol electrode 10 made of a superconducting ceramic formed over the barrier film 4 with the insulating film 11 therebetween. The current passing through the barrier film 4 is controlled by the applied voltage by the control electrode 10. In this embodiment, the barrier film 4 may be superconducting. The operation temperature of the device should be selected so that the superconducting barrier film 4 is in an intermediate state between superconducting state and non-superconducting state. Namely, the temperature is selected within the range from Tc onset and Tco.

Referring to FIG. 4(C), a sixth embodiment is illustrated. This device is approximately same as the fifth embodiment except for provision of an underlying control electrode 10'. The barrier film 4 is sandwitched by the overlying control film 10 and the underlying cotrol film 10'.

Superconducting ceramics for use in accordance with the present invention also may be prepared in consistence with the stoichiometric formulae $(A_{1-x}B_x)_yCu_zO_w$, where A is one or more elements of Group IIIa of the Priodic Table, e.g., the rare earth elements, B is one or more elements of Group IIa of the Periodic Table, e.g., the alkaline earth metals including beryllium and magnesium, and $x=0-1$; $y=2.0-4.0$, preferably 2.5–3.5; $z=1.0-4.0$, preferably 1.5–3.5; and $w=4.0-10.0$, preferably 6.0–8.0. Also, superconducting ceramics for use in accordance with the present invent i on may be prepared consistent with the stoichiometric formulae $(A_{1-x}B_x)_yCu_zO_w$, where A is one or more elements of Group Vb of the Priodic Table such as Bi, Sb and As, B is one or more elements of Group IIa of the Periodic Table, e.g., the alkaline earth metals including beryllium and magnesium, and $x=0.3-1$; $y=2.0-4.0$, preferably 2.5–3.5; $z=1.0-4.0$, preferably 1.5–3.5; and $w=4.0-10.0$, preferably 6.0–8.0. Examples of this general formula are $BiSrCaCuCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40°–60° K., which is not so high. Relatively high critical temperatuers were obtained with samples conforming to the stoichiometric formulae $Bi_4Sr_4Ca_2Cu_4O_x$ and $Bi_2Sr_3Ca_2Cu_2O_x$. FIGS. 7 and 8 are graphical diagrams showing the relationship between the resistivity and the temperature for both samples. The number x denoting the oxygen proportion is 6–10, e.g. around 8.1. Such superconducting materials can be formed by screen press printing, vacuum evaporation or CVD.

While a description has been made for several embodiments, the present invent i on should be limited only by the appended claims and should not be limited by the particualr examles. For example, the present invetnion can be applied for SQUIDs, VLSIs or ULSIs. The superconducting ceramics in accordance with the present invention may have single crystalline or polycrystalline structures.

I claim:

1. A method of producing a superconducting pattern comprising:
   forming an oxide superconducting film on a surface;
   having its C plane parallel to a surface of a substrate in said film;
   wherein a selected portion of said superconducting film is doped with dopant in order that the superconductivity in said portion is decreased.

2. The method of claim 1, wherein said oxide superconducting film is separated into two parts with said portion therebetween.

3. The method of claim 2, wherein said doped portion is in the form of a barrier layer and the thickness thereof is thin enough so that a current can pass therethrough.

4. A method of producing a superconducting pattern comprising:
   forming an oxide superconducting film on a surface of a non-superconducting substrate having its C plane parallel to said surface in said film;
   wherein a selected portion of said superconducting film is doped with dopant in order that the superconductivity in said portion is decreased and said portion having a decreased superconductivity is utilized as an insulating portion so that said superconducting portion is electrically isolated from adjacent superconducting portion.

5. The method as defined in claim 4, wherein said selected portion is doped by ion implantation.

6. The method as defined in claim 4, wherein said selected portion is doped by ion implantation to $5 \times 10^{18}$–$6 \times 10^{21}$ cm$^{-3}$.

7. The method as defined in claim 4, wherein said dopant is selected from a group including Si, Ge, B, Ga, P, Ta, Mg, Be, Al, Fe, Co, Ni, Cr, Ti, Mn and Zr, and mixtures thereof.

8. The method as defined in claim 4, wherein said oxide superconducting film is formed of a superconducting ceramic material satisfying a stoichrometric formula;

$$(A_{1-x}B_x)_y Cu_z O_w$$

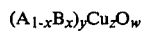

where A is at least one element of Group Vb of the Periodic table, B is at least one element from Group IIa of the periodic table, x=0.3–1.0, y=2.0–4.0, z=1.0–4.0 and w=4.0–10.0.

9. The method of claim 8, wherein said superconducting ceramic material is of a single crystalline structure.

10. The method of claim 8, wherein said superconducting ceramic material is of a polycrystalline structure.

11. A method of producing a superconducting pattern comprising:
    forming an oxide superconducting film on a surface of a non-superconducting substrate;
    having its C plane parallel to said surface in said film;
    wherein a selected portion of said superconducting film is doped with dopant in order that the superconductivity in said portion is decreased and said portion having a decreased superconductivity is utilized as a part of a device so that a superconducting current can be passed therethrough.

12. The method as defined in claim 11, wherein said selected portion is doped by ion implantation.

13. The method as defined in claim 11, wherein said selected portion is doped by ion implantation to $5 \times 10^{18}$–$6 \times 10^{21}$ cm$^{-3}$.

14. The method as defined in claim 11, wherein said dopant is selected from a group including Si, Ge, B, Ga, P, Ta, Mg, Be, Al, Fe, Co, Ni, Cr, Ti, Mn and Zr, and mixtures thereof.

15. The method as defined in claim 11, wherein said oxide superconducting film is formed of a superconducting ceramic material satisfying a stoichiometric formula;

$$(A_{1-x}B_x)_y Cu_z O_w$$

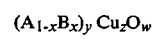

where A is at least one element of Group Vb of the Periodic Table, B is at least one element from Group IIa of the Periodic Table, x=0.3–1.0, y=2.0–4.0, z=1.0–4.0 and w=4.0–10.0.

16. The method of claim 15, wherein said superconducting ceramic material is of a single crystalline structure.

17. The method of claim 15, wherein said superconducting ceramic material is of a polycrystalline structure.

18. A method of producing a superconducting pattern comprising:
    forming an oxide superconducting film on a surface of a non-superconducting substrate;
    establishing a superconducting structure;
    wherein a selected portion of said superconducting structure is doped with dopant using ion implantation method at a concentration of $5 \times 10^{18}$–$6 \times 10^{21}$ cm$_{-3}$ in order that the superconductivity in said portion is decreased;
    wherein said dopant is selected from a group including Si, Ge, B, Ga, P, Ta, Mg, Be, Al, Fe, Co, Ni, Cr, Ti, Mn and Zr, and mixtures thereof.

19. The method as defined in claim 18, wherein said oxide superconducting film is formed of a superconducting ceramic material satisfying a stoichiometric formula;

$$(A_{1-x}B_x)_y Cu_z O_w$$

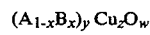

where A is at least one element of Group Vb of the Periodic Table, B is at least one element from Group IIa of the Periodic Table, x=0.3–1.0, y=2.0–4.0, z=1.0–4.0 and w=4.0–10.0.

20. The method of claim 19, wherein said superconducting ceramic material is of a single crystalline structure.

21. The method of claim 19, wherein said superconducting ceramic material is of a polycrystalline structure.

* * * * *